United States Patent
Hsieh et al.

(10) Patent No.: US 6,777,764 B2
(45) Date of Patent: Aug. 17, 2004

(54) ONO INTERPOLY DIELECTRIC FOR FLASH MEMORY CELLS AND METHOD FOR FABRICATING THE SAME USING A SINGLE WAFER LOW TEMPERATURE DEPOSITION PROCESS

(75) Inventors: Jung-Yu Hsieh, Hsinchu (TW); Tzung-Ting Han, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/237,668

(22) Filed: Sep. 10, 2002

(65) Prior Publication Data

US 2004/0046218 A1 Mar. 11, 2004

(51) Int. Cl.⁷ .............................................. H01L 31/119
(52) U.S. Cl. .......................... 257/411; 257/406; 257/314; 257/315; 257/316; 257/324; 438/201; 438/211; 438/257; 438/261; 438/791
(58) Field of Search ................................. 257/411, 406, 257/314–316, 324; 438/201, 211, 257, 261, 791

(56) References Cited

U.S. PATENT DOCUMENTS

| | | | |
|---|---|---|---|
| 5,925,908 A | * | 7/1999 | Dahl et al. .................. 257/316 |
| 6,051,467 A | * | 4/2000 | Chan et al. .................. 438/264 |
| 6,156,610 A | * | 12/2000 | Rolandi ...................... 438/258 |
| 6,204,125 B1 | | 3/2001 | Lee et al. |
| 6,248,628 B1 | * | 6/2001 | Halliyal et al. .............. 438/257 |
| 6,339,000 B1 | * | 1/2002 | Bhattacharya et al. ....... 438/261 |
| 6,413,820 B2 | | 7/2002 | Bui |
| 6,501,122 B1 | * | 12/2002 | Chan et al. .................. 257/315 |
| 6,576,548 B1 | * | 6/2003 | Tu et al. ..................... 438/640 |

* cited by examiner

Primary Examiner—Minhloan Tran
Assistant Examiner—Remmon R. Fordé
(74) Attorney, Agent, or Firm—Finnegan, Henderson, Farabow, Garrett & Dunner, L.L.P.

(57) ABSTRACT

A method of fabricating a semiconductor device is disclosed. A wafer substrate is provided. A first silicon oxide layer is formed over the wafer substrate. A nitride layer is formed over the first silicon oxide layer using a low temperature deposition process. A second silicon oxide layer is formed over the nitride layer. The low temperature process can form a nitride layer for an oxide-nitride-oxide (ONO) dielectric structure at about a temperature of 700° C. By such a process, an ONO dielectric structure can be formed using a low temperature deposition process, which can reduce the thickness of the ONO dielectric structure.

14 Claims, 2 Drawing Sheets

US 6,777,764 B2

ONO INTERPOLY DIELECTRIC FOR FLASH MEMORY CELLS AND METHOD FOR FABRICATING THE SAME USING A SINGLE WAFER LOW TEMPERATURE DEPOSITION PROCESS

FIELD OF THE INVENTION

The invention relates generally to semiconductor devices and fabrication methods, and, more particularly, to an ONO interpoly dielectric for flash memory cells and method for fabricating the same using a single wafer low temperature deposition process.

BACKGROUND OF THE INVENTION

One type of semiconductor device is a flash memory device, which includes a floating-gate electrode for storing electrical charge. The electrical charge is provided from a channel region underneath the floating-gate electrode. The floating-gate electrode typically includes a dielectric material for storing the electrical charge. A common dielectric structure for a floating-gate electrode is an oxide-nitride-oxide nitride-oxide ("ONO") structure.

This type of structure plays an essential role regarding operating characteristics and reliability of the flash memory device. A high quality ONO dielectric structure should provide, e.g., low defect density, long mean time to failure, and high charge retention capability.

One method for forming an ONO dielectric uses a single wafer thermal process. A conventional process requires an elevated high temperature of about 800° C. to deposit the dielectric film. This process has a number of disadvantages because of the high temperature. For example, the high temperature process can cause surface roughness of the dielectric material, low time dependent dielectric breakdown ("TDDB"), and low yields.

Thus, what is needed is a low temperature deposition process to deposit an ONO dielectric material and to reduce the surface roughness of the ONO dielectric material.

SUMMARY OF THE INVENTION

In accordance with the invention, there is provided a method of manufacturing a semiconductor device, including providing a wafer substrate, forming a first silicon oxide layer over the wafer substrate, forming a nitride layer over the first silicon oxide layer using a low temperature deposition process, and forming a second silicon oxide layer over the nitride layer. In one aspect, the first silicon oxide layer is formed over a floating gate poly.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate exemplary embodiments of the invention and together with the description, serve to explain the principles of the invention. In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
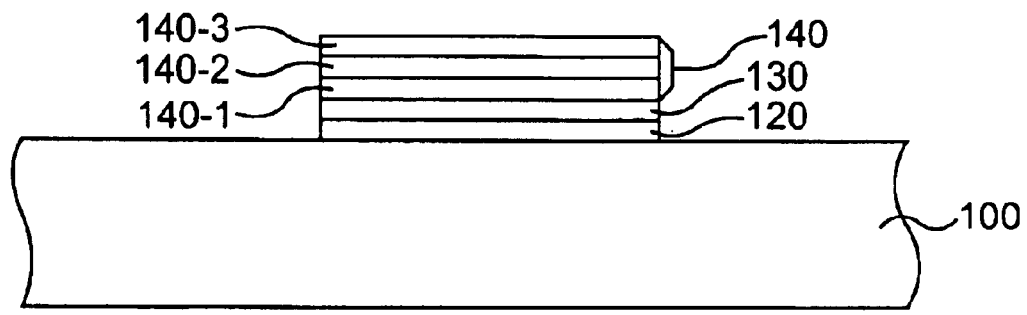
FIGS. 1 and 2 are cross-sectional views illustrating fabrication steps for making a semiconductor device.
Figure 2:
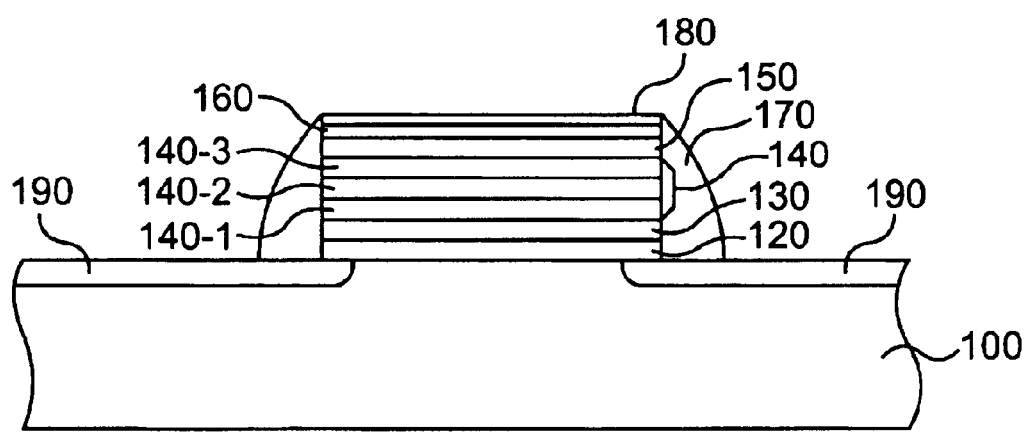

FIGS. 1 and 2 are cross-sectional views illustrating fabrication steps for making a semiconductor device. Referring to FIG. 1, a wafer substrate 100 is provided for forming active devices. A tunnel oxide 120 is formed or deposited over substrate 100. A polysilicon layer 130 is formed over tunnel oxide 120. The polysilicon layer 130 can act as a floating-gate—("floating-gate 130").

A stacked dielectric film or material 140 is then formed over floating-gate 130. The dielectric film 140 includes a first oxide layer 140-1, a nitride layer 140-2, and a second oxide layer 140-3. This structure can be referred to as an oxide-nitride-oxide ("ONO") dielectric structure. In one embodiment, the first oxide layer 140-1 is deposited over floating-gate 130 using a conventional low pressure chemical vapor deposition ("LPCVD") process under a pressure of about 200 Torrs by reacting, e.g., silane ($SiH_4$) with nitrous oxide ($N_2O$).

Nitride layer 140-2 is formed or deposited over first oxide layer 140-1 using a low temperature deposition process, wherein $SiH_4$ and ammonia ($NH_3$) are introduced as reaction gases. In one embodiment, the deposition process for depositing the nitride layer 140-2 proceeds at a temperature of about 700° C. and under a pressure of about 275 Torrs. Next, the second oxide layer 140-3 is formed or deposited over the nitride layer 140-2 using a conventional LPCVD process. In one embodiment, the first oxide layer 140-1 has a thickness of about 43 Angstroms. The nitride layer 140-2 can have a thickness of about 62 Angstroms, and the second oxide layer 140-3 can have a thickness of about 59 Angstroms.

Referring to FIG. 2, conventional semiconductor processes can be used to form a control gate 150 over second oxide layer 140-3 of the ONO dielectric film 140. A silicide layer 160 is formed over control gate 150. Spacers 170 are formed contiguous with the vertical sidewalls of gate 150 and a cap 180 is formed over silicide layer 160. Finally, diffused regions 190, which may be the source and drain regions, are formed in substrate 100.

Figure 3:
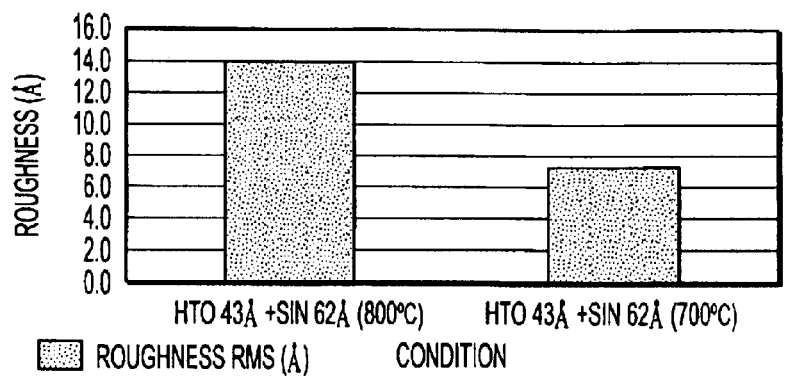
FIG. 3 illustrates a graph of the roughness of an ONO dielectric material at 800° C. and at 700° C.

As a result of low temperature deposition process, the ONO film 140 has a higher nucleation density at an early stage of film growth. The nitride layer 140-2 can therefore exhibit a smoother surface as compared to conventional high temperature deposition processes. For example, it has been observed that a silicon nitride layer formed at a high temperature of about 800° C. has a rougher surface than the silicon nitride layer formed at a low temperature of 700° C., as illustrated by the graph of FIG. 3. That is, lowering the deposition temperature provides a higher nucleation density at an early stage of film growth that provides a smoother surface.

Figure 4:
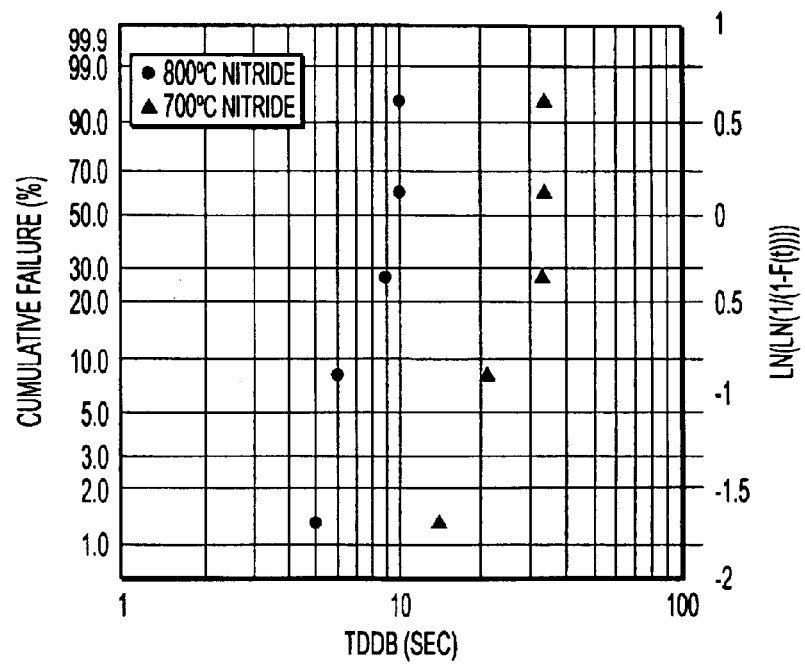
FIG. 4 illustrates a graph of the cumulative failure for an ONO dielectric material at 800° C. and at 700° C.
Figure 5:
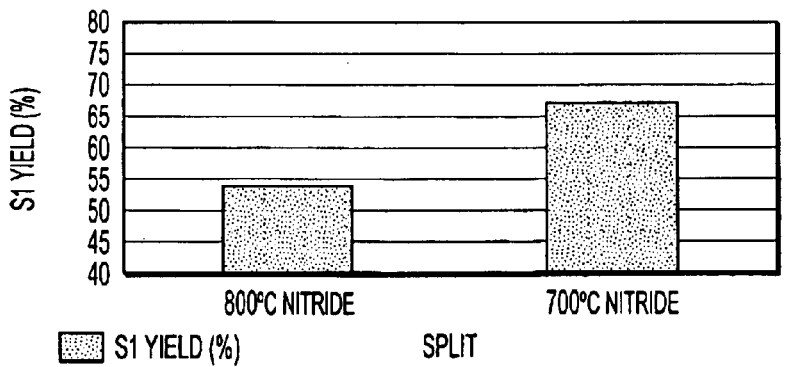
FIG. 5 illustrates a graph of the percent yield of an ONO dielectric material at 800° C. and at 700° C.

Referring to FIG. 4, it has been observed that a nitride layer fabricated according to the process above has a higher TDDB than films fabricated according to conventional high temperature deposition methods. That is, the TDDB can be three times higher for nitride formed at 700° C. than at 800° C. FIG. 5 shows a graph illustrating that a nitride layer fabricated according to the process above has a higher Si yield than nitride by conventional high temperature deposition methods. As shown in the graph, a 13% improvement can be achieved by reducing the nitride deposition process to a temperature of about 700° C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor device, comprising:
   providing a wafer substrate;
   forming a first silicon oxide layer over the wafer substrate;
   forming a nitride layer over the first silicon oxide layer using a low temperature deposition process; and
   forming a second silicon oxide layer over the nitride layer.

2. The method of claim 1, further comprising forming a floating gate poly over the wafer substrate, and wherein the first silicon oxide layer is formed over the floating gate poly.

3. The method of claim 1, wherein forming the nitride layer includes depositing the nitride layer at a temperature of about 700° C.

4. The method of claim 1, wherein forming the nitride layer includes depositing the nitride layer under a pressure of about 275 Torrs.

5. The method of claim 1, wherein forming the first silicon oxide layer includes reacting silane with nitrous oxide under a pressure of about 200 Torrs.

6. The method of claim 1, wherein the first silicon oxide layer has a thickness of about 43 Angstroms.

7. The method of claim 1, wherein the nitride layer has a thickness of about 62 Angstroms.

8. The method of claim 1, wherein the second silicon oxide layer has a thickness of about 59 Angstroms.

9. A semiconductor device, comprising:
   a substrate;
   a first oxide layer formed over the substrate;
   a nitride layer formed on the first oxide layer, wherein the nitride layer is formed using a low temperature deposition process; and
   a second oxide layer formed over the nitride layer.

10. The device of claim 9, further comprising a floating gate poly formed over the substrate, and wherein the first oxide layer is formed over the floating gate poly.

11. The device of claim 9, wherein the nitride layer is formed at a temperature of about 700° C.

12. A semiconductor device, comprising:
    a substrate; and
    a floating-gate electrode formed over the substrate, the floating-gate electrode includes:
      a first oxide layer formed over the substrate,
      a nitride layer formed on the first oxide layer, wherein the nitride layer is formed using a low temperature deposition process, and
      a second oxide layer formed over the nitride layer.

13. The device of claim 12, wherein the floating-gate electrode further comprises a floating gate poly formed over the substrate, and wherein the first oxide layer is formed over the floating gate poly.

14. The device of claim 12, wherein the nitride layer is formed at a temperature of about 700° C.

* * * * *